(12) United States Patent
Yoneda et al.

(10) Patent No.: US 6,995,044 B2
(45) Date of Patent: Feb. 7, 2006

(54) MANUFACTURING METHOD OF A SEMICONDUCTOR DEVICE INCORPORATING A PASSIVE ELEMENT AND A REDISTRIBUTION BOARD

(75) Inventors: Yoshiyuki Yoneda, Kawasaki (JP); Masaharu Minamizawa, Kawasaki (JP); Nobutaka Shimizu, Kawasaki (JP); Atsushi Kikuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 131 days.

(21) Appl. No.: 10/650,692

(22) Filed: Aug. 29, 2003

(65) Prior Publication Data

US 2004/0053444 A1 Mar. 18, 2004

Related U.S. Application Data

(62) Division of application No. 10/100,011, filed on Mar. 19, 2002, now Pat. No. 6,875,638.

(30) Foreign Application Priority Data

Oct. 31, 2001 (JP) ............................. 2001-335413

(51) Int. Cl.
*H01L 21/44* (2006.01)
*H01L 21/48* (2006.01)
*H01L 21/50* (2006.01)

(52) U.S. Cl. .................................................. 438/125

(58) Field of Classification Search .......... 438/107, 438/108, 113, 125, 455, 458, 459, 464
See application file for complete search history.

(56) References Cited

U.S. PATENT DOCUMENTS

| 5,055,907 | A |   | 10/1991 | Jacobs |           |
|-----------|---|---|---------|--------|-----------|
| 5,192,716 | A |   | 3/1993  | Jacobs |           |
| 5,654,590 | A | * | 8/1997  | Kuramochi | ......... 257/778 |
| 6,294,407 | B1 | * | 9/2001 | Jacobs | ............ 438/118 |
| 2002/0180013 | A1 | * | 12/2002 | Brofman et al. | ...... 257/678 |

FOREIGN PATENT DOCUMENTS

| JP | 3-246993 | 11/1991 |
| JP | 4-291993 | 10/1992 |
| JP | 5-259639 | 10/1993 |
| JP | 7-321490 | 12/1995 |
| JP | 2000-306771 | 11/2000 |
| JP | 2001-36236 | 2/2001 |
| JP | 2001-274036 | 10/2001 |

* cited by examiner

*Primary Examiner*—David A. Zarneke
(74) *Attorney, Agent, or Firm*—Westerman, Hattori, Daniels & Adrian, LLP

(57) ABSTRACT

A manufacturing method of a semiconductor device incorporating a passive element includes the steps as follows: a redistribution board forming step forms a redistribution board incorporating the passive element on a base board; a semiconductor element mounting step mounts at least one semiconductor element formed on an opposite side surface of the redistribution board with regard to the base board; a base board separating step separates the base board from the redistribution board and exposes the other surface of the redistribution board; a redistribution board mounting step mounts the redistribution board on a package board via electrode pads exposed from the other surface of the redistribution board.

8 Claims, 15 Drawing Sheets

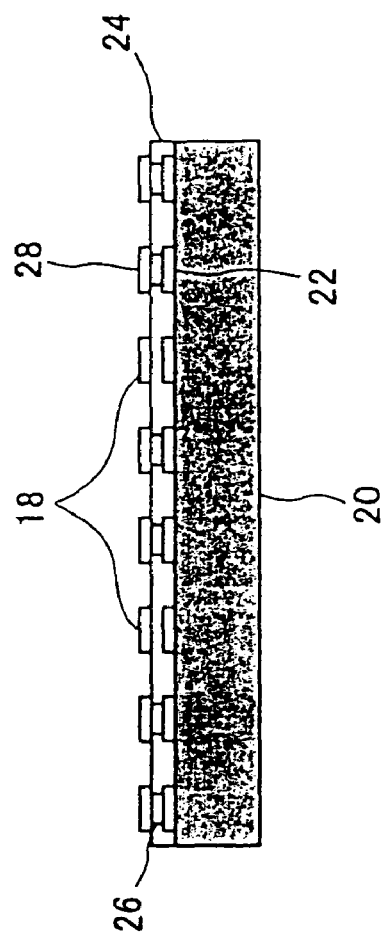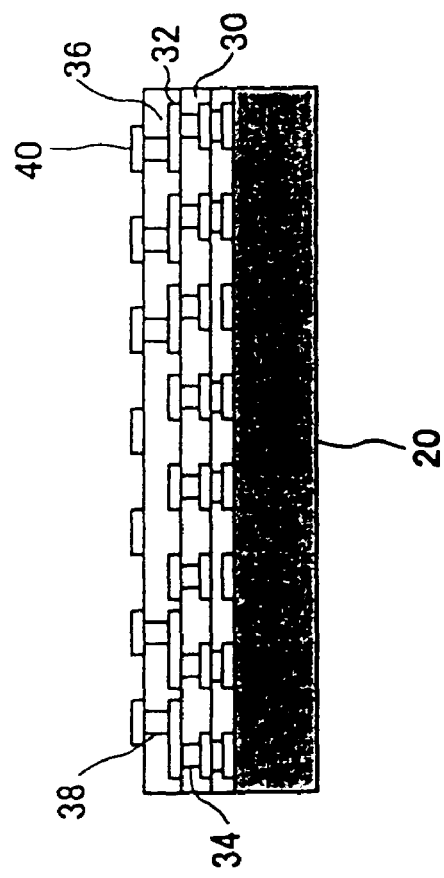

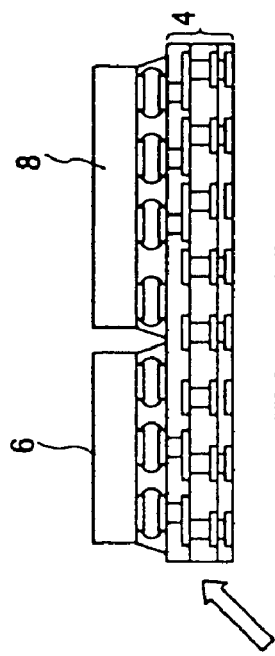
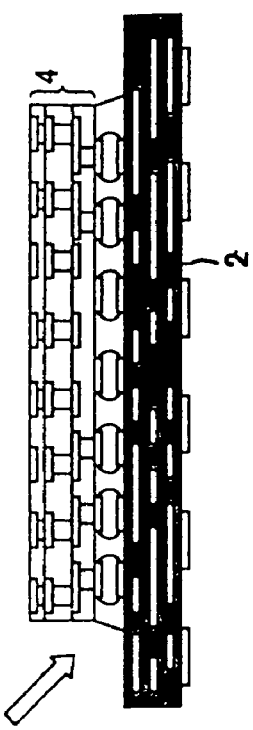

FIG. 10A
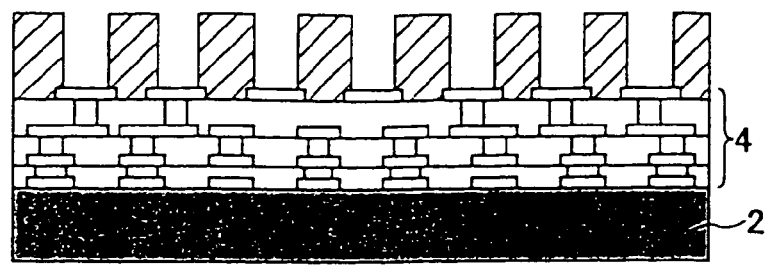
FIG. 10B
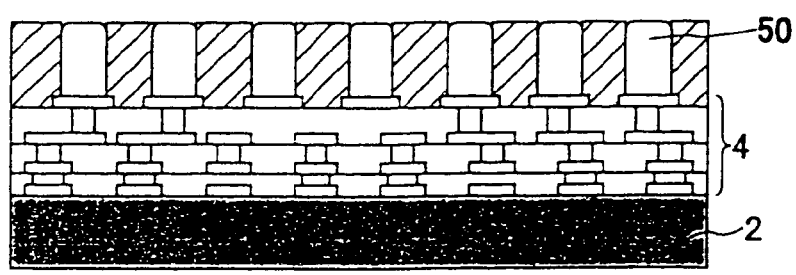
FIG. 10C
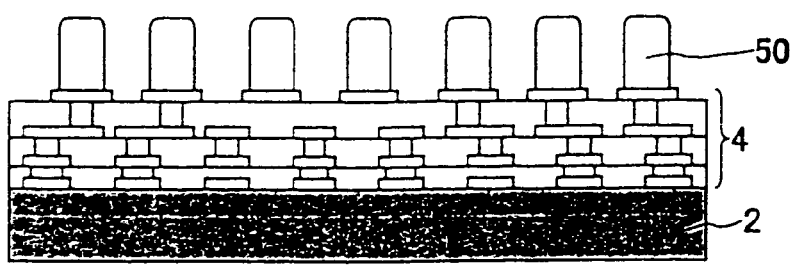
FIG. 10D
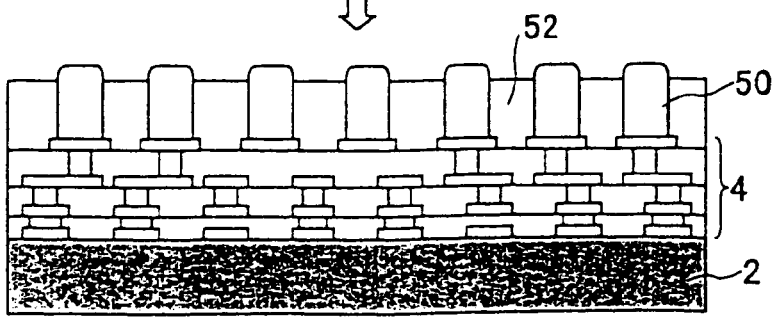

MANUFACTURING METHOD OF A SEMICONDUCTOR DEVICE INCORPORATING A PASSIVE ELEMENT AND A REDISTRIBUTION BOARD

This application is a Divisional of prior application Ser. No. 10/100,011 filed Mar. 19, 2002 now U.S. Pat. No. 6,875,638.

BACKGROUND OF THE INVENTION

1. Field of the Invention

The present invention generally relates to a semiconductor device mounting a logic device and the like that requires high-speed processing, and more particularly, to a semiconductor device incorporating a passive element such as a capacitor in a package.

2. Description of the Related Art

Generally, in a semiconductor device mounting an LSI that operates at high speed, a bypass condenser is incorporated in a package board in order to prevent variation of power supply voltage and malfunction due to high-frequency noise, and to secure stable operation in a high-speed operation area.

The bypass condenser is mounted on the package board as a different chip part from a semiconductor element that is mounted on the package board by flip chip mounting (FC mounting). In order to make the bypass condenser function effectively, it is necessary to place the bypass condenser near the semiconductor element. In many cases, the bypass condenser is placed at an opposite side of the package board with regard to the part on which the semiconductor element is mounted.

However, it is difficult to secure an area for mounting the bypass condenser on the package board close to the part where the semiconductor elements are mounted when mounting terminals for many signals and mounting terminals for power source and grounding are placed, or when a plurality of semiconductor elements are mounted on the package board as a system-in package. Accordingly, a structure is proposed in which the bypass condenser is placed inside the package board.

For example, an attempt has been made to incorporate the bypass condenser in the package board such as a glass ceramic board. However, a yield ratio may be reduced and an increase in costs may be caused since the number of wiring layers increases compared with a current situation and it is necessary to introduce a special material and a process.

As a method to solve this problem, it is conceived that a conventional board is used for the package board and only the semiconductor element requiring the bypass condenser is mounted on the package board via a redistribution board incorporating the capacitor.

However, board technology (wiring, multilayer, via forming technology) is required that can correspond to a minute electrode pad of the semiconductor element and a pitch between the electrode pads. Additionally, it is necessary to form vias so that a circuit on the redistribution board passes through to a reverse side of the redistribution board. Thus, it is substantially difficult to further reduce costs as achieving performance of a device. As a matter of course, it is necessary to structure the redistribution board as simply as possible in order to satisfy electric properties required by the semiconductor element mounted and to reduce costs.

However, when a thickness of the redistribution board becomes thin by simplifying the structure of the redistribution board, rigidity of the redistribution board is decreased. Thus, the redistribution board may be deformed or damaged easily in a manufacturing process of the semiconductor device.

SUMMARY OF THE INVENTION

It is a general object of the present invention to provide an improved and useful manufacturing method of a semiconductor device and a redistribution board in which the above-mentioned problems are eliminated.

A more specific object of the present invention is to provide a manufacturing method of a semiconductor device packaging the semiconductor element and a redistribution board incorporating a passive element such as the bypass condenser and a preferred redistribution board for such a semiconductor device in which the above-mentioned problems are eliminated.

In order to achieve the above-mentioned objects, there is provided according to one aspect of the present invention a manufacturing method of a semiconductor device incorporating a passive element comprising the steps of: a redistribution board forming step forming a redistribution board incorporating the passive element on a base board; a semiconductor element mounting step mounting at least one semiconductor element on an opposite side surface of the redistribution board formed on the base board with regard to the base board; a base board separating step separating the base board from the redistribution board and exposing the other surface of the redistribution board; and a redistribution board mounting step mounting the redistribution board on a package board via electrode pads exposed from the other surface of the redistribution board.

According to the above-mentioned aspect of the present invention, the redistribution board is fixed to the bas board until the semiconductor element is mounted on the redistribution board, thus the base board reinforces the redistribution board. Additionally, the semiconductor element functions to reinforce the redistribution board after the base board is removed. Thus, the redistribution board is prevented from being deformed or damaged since the redistribution board is always reinforced by the base board or the semiconductor element and not handled by itself.

The object described above is also achieved, according to another aspect of the present invention, by the manufacturing method of the semiconductor device mentioned above, wherein the semiconductor element mounting step includes a step of filling between the redistribution board and the semiconductor element with an under fill material.

According to the above-mentioned aspect of the present invention, the redistribution board is further reinforced by the under fill material.

The object described above is also achieved, according to another aspect of the present invention, by a manufacturing method of a semiconductor device incorporating a passive element comprising the steps of: a redistribution board forming step forming a redistribution board incorporating the passive element on a base board; a redistribution board mounting step mounting the redistribution board formed on the base board on a package board via electrode pads exposed from the other surface of the redistribution board; a base board separating step separating the base board from the redistribution board and exposing the other surface of the redistribution board; and a semiconductor element mounting step mounting at least one semiconductor element on the redistribution board via electrode pads exposed from the other surface of the redistribution board.

According to the above-mentioned aspect of the present invention, the redistribution board is fixed to the base board until the redistribution board is mounted on the package board, thus the base board reinforces the redistribution board. Additionally, the package board functions to reinforce the redistribution board after the base board is removed. Thus, the redistribution board is prevented from being deformed or damaged since the redistribution board is always reinforced by the base board or the package board and not handled by itself.

The object described above is also achieved, according to another aspect of the present invention, by the manufacturing method of the semiconductor device mentioned above, wherein the redistribution board mounting step includes a step of filling between the redistribution board and the package board with the under fill material.

According to the above-mentioned aspect of the present invention, the redistribution board is further reinforced.

The object described above is also achieved, according to another aspect of the present invention, by the manufacturing method of the semiconductor device, wherein the base board is made of a silicon wafer, a plurality of the redistribution boards are integrally formed on the silicon wafer, and the redistribution boards are individualized after the base board removing step.

According to the above-mentioned aspect of the present invention, it is possible to handle a plurality of the redistribution boards integrally and to simplify the semiconductor production process.

The object described above is also achieved, according to another aspect of the present invention, by a manufacturing method of a semiconductor device incorporating a passive element comprising: a redistribution board forming step forming a redistribution board incorporating the passive element on a base board; a base board separating step separating the base board from the redistribution board; a semiconductor element mounting step mounting at least one semiconductor element on the redistribution board via electrode pads formed on a surface of the redistribution board; and a redistribution board mounting step mounting the redistribution board on a package board via electrode pads formed on the other surface of the redistribution board.

According to the above-mentioned aspect of the present invention, flexibility of the semiconductor production process is increased since the mounting process can be started on either surface of the redistribution board.

The object described above is also achieved, according to another aspect of the present invention, by the manufacturing method of the semiconductor device mentioned above, wherein the redistribution board forming step includes a step of forming columnar metal members on electrode pads of the redistribution board formed on an opposite side of the base board, and a step of filling between the columnar metal members with insulating resin.

According to the above-mentioned aspect of the present invention, it is possible to prevent the redistribution board from being deformed or damaged since the redistribution board is reinforced by the insulating resin.

The object described above is also achieved, according to another aspect of the present invention, by the manufacturing method of the semiconductor device mentioned above, wherein the redistribution board forming step includes a step of forming columnar metal members on electrode pads of the redistribution board formed on an opposite side of the base board, and a step of filling between the columnar metal members with insulating resin.

According to the above-mentioned aspect of the present invention, it is possible to prevent the redistribution board from being deformed or damaged in the manufacturing process of the semiconductor since the insulating resin reinforces the redistribution board.

The object described above is also achieved, according to another aspect of the present invention, by the redistribution board mentioned above, wherein the columnar metal members are made of a copper plated layer deposited in a columnar structure.

According to the above-mentioned aspect of the present invention, it is possible to deposit the copper plating in a columnar structure by a lithography technology using photoresist so as to form the columnar metal members easily on the electrode pads.

The object described above is also achieved, according to another aspect of the present invention, by the redistribution board mentioned above, wherein the columnar metal members are made of gold wire and connected with the electrode pads by a wire bonding method.

According to the above-mentioned aspect of the present invention, it is possible to form the columnar metal members easily by bonding the gold wire with the electrode pads.

The object described above is also achieved, according to another aspect of the present invention, by a manufacturing method of a redistribution board incorporating a passive element comprising the steps of: a step of forming a copper sputter film on a ceramic board; a redistribution board forming step forming the redistribution board incorporating the passive element on the copper sputter film; a base board separating step exfoliating and separating the ceramic board from the copper sputter film; and a step of removing the copper sputter film by etching and exposing electrodes of the redistribution board.

According to the above-mentioned aspect of the present invention, it is possible to exfoliate the ceramic board as the base board from the redistribution board including the copper sputter film easily since the adhesion between the copper sputter film and the ceramic board is weak. The redistribution board can be formed by removing the copper sputter film after the ceramic board is exfoliated.

Other objects, features and advantages of the present invention will become more apparent from the following detailed description when read in conjunction with the following drawings.

BRIEF DESCRIPTION OF THE DRAWINGS

FIGS. 2A and 2B are cross sectional views for explaining a structure of a redistribution board and manufacturing process;

FIGS. 8A, 8B, 8C and 8D are cross sectional views for explaining a manufacturing method of a semiconductor device according to a third embodiment of the present invention;

FIGS. 10A, 10B, 10C and 10D are cross sectional views for explaining the manufacturing process of the redistribution board shown in FIG. 9;

DETAILED DESCRIPTION OF THE PREFERRED EMBODIMENTS

Next, a description will be given of embodiments of the present invention.

Figure 1:
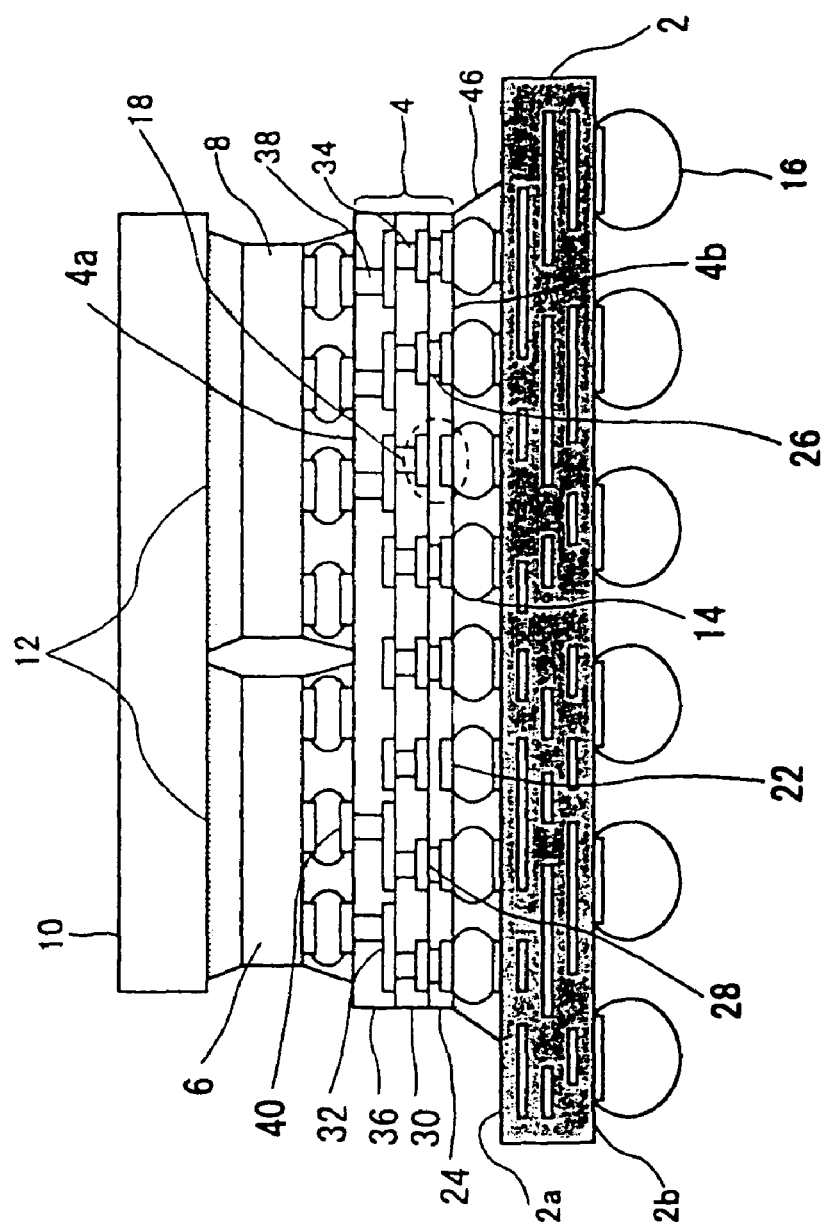
FIG. 1 is a cross sectional view of a semiconductor device according to a first embodiment of the present invention.

FIG. 1 is a cross sectional view of a semiconductor device according to a first embodiment of the present invention. The semiconductor device according to the first embodiment of the present invention includes a package board 2, a redistribution board 4 connected with the package board 2, a first semiconductor element 6 and a second semiconductor element 8. The first and second semiconductor elements 6 and 8 are mounted on the redistribution board 4. Further, the number of the semiconductor elements mounted on the redistribution board 4 may be one, or three or more. Additionally, in this embodiment, a heat spreader 10 is fixed to back surfaces of the first and second semiconductor elements by an adhesive 12. The heat spreader 10 functions so as to accelerate heat dissipation from the semiconductor elements 6 and 8. However, the heat spreader 10 is not always necessary and provided in case of need.

The package board 2 is structured by a glass ceramic board, an alumina board or a built-up board. On a top surface 2a of the package board 2, electrode pads connected with solder bumps 14 are formed. On an under surface 2b of the package board 2, electrode pads are formed where solder balls 16 are formed as external terminals. The package board 2 is a multilayered structure. The electrode pads on the top surface 2a are electrically connected with the corresponding electrode pads on the under surface 2b by vias or the like which penetrate through layers.

As shown in FIG. 1, the redistribution board 4 has a multilayerd structure. Built-in capacitors 18 that function as the bypass condensers are formed inside the redistribution board 4. Electrode pads formed by a first electric conductive layer are exposed from an under surface 4b of the redistribution board 4 and connected with the corresponding electrode pads of the package board 2 via the solder bumps 14. Additionally, electrode pads formed by a fourth electric conductor are exposed from a top surface 4a of the redistribution board 4 and using these electrode pads, the first and second semiconductor elements 6 and 8 are mounted on the redistribution board 4 by flip chip mounting.

FIGS. 2A and 2B respectively are cross sectional views for explaining the structure of the redistribution board 4 and manufacturing process. First, as shown in FIG. 2A, electrode pads are formed by forming a pattern of platinum thin film as the first electric conductor 22 on a base board 20 such as a silicon board or the like. Next, a BST film (barium/strontium/titanium filter) having a high dielectric constant is formed as a first insulating layer 24. Then, after forming first vias 26 at necessary positions, electrode pads are formed by forming a pattern of the platinum thin film as a second electric conductive layer 28 on the first insulating layer 24. Among the electrode pads formed on both sides of the first insulating layer 24, pairs of the electrode pads connected by the first vias 26 function as electrically conductive parts. On the other hand, pairs of the electrode pads facing without the first via 26 function as capacitors since the BST film having the high dielectric constant stands between. These capacitors become the incorporated capacitors 18 and function as the bypass condensers when incorporated in the semiconductor device.

Next, as shown in FIG. 2B, a second insulating layer 30 is formed on the second electric conductive layer 28. A copper wiring pattern is formed on the second insulating layer 30 as a third electric conductive layer 32. The second insulating layer 30 is formed by polyimide, BCB film or the like. Viaholes are formed in corresponding positions of the electrode pads of the second electric conductive layer 28. A third electric conductive layer 32 is formed by copper (Cu) plating, for example, and second vias 34 are formed in the viaholes. Thus, the copper wiring pattern 32 formed on the second insulating layer 30 and the platinum thin film wiring pattern formed as the second electric conductive layer 28 are electrically connected by the second vias 34. The copper wiring pattern as the third electric conductive layer 32 becomes a wiring pattern for redistribution.

Next, a third insulating layer 36 is formed on the third electric conductive layer 32. A copper wiring pattern is formed on the third insulating layer 36 as a fourth electric conductive layer 40. The third insulating layer 36 is formed by polyimide, BCB film or the like. Viaholes are formed in corresponding positions of the copper wiring pattern of the third electric conductive layer 32. A fourth electric conductive layer 40 is formed by copper (Cu) plating, for example, and third vias 38 are formed in the viaholes. Thus, the copper wiring formed on the second insulating layer 30 and the copper wiring pattern formed on the third insulating layer 36 are electrically connected by the third vias 38. The copper wiring pattern as the fourth electric conductive layer 40 is formed as the electrode pads. On these electrode pads, the above-described first and second semiconductor elements 6 and 8 are mounted by flip chip mounting.

When forming the above-described third and fourth electric conductive layers 32 and 40 by copper plating, it is desirable to form sputter thin films of such as Ti, Cr, W or the like prior to the copper plating in order to secure adhesion with the respective insulating layers below the third and fourth electric conductive layers 32 and 40, and to enable electrolytic plating. Additionally, a thickness of the second and third insulating layers 30 and 36 is 2 μm to 10 μm. A thickness of the copper wiring patterns 32 and 40 is approximately several micrometers. In addition, the wiring pattern as the fourth electric conductive layer 40 corresponds to the electrode pads mounting the semiconductor elements 6 and 8 by flip chip packaging. Thus, it is preferable to perform barrier metal plating such as Ni plating or the like and plating of such as Au, Pd, Sn or the like to the fourth electric conductive layer.

As shown in FIG. 2B, the redistribution board 4 is formed on the base board 20. However, the base board 20 is removed when manufacturing the semiconductor device using the redistribution board 4. Since the redistribution board 4 is thin, it may be easily deformed or damaged when separated from the base board 20.

Further, the above-described redistribution board 4 may be manufactured by a method proposed in Japanese Laid-Open Patent Application No. 2001-274036.

Next, a description will be given of the manufacturing process of the semiconductor device according to the present invention with reference to FIGS. 3A, 3B, 3C and 4.

Figure 4:
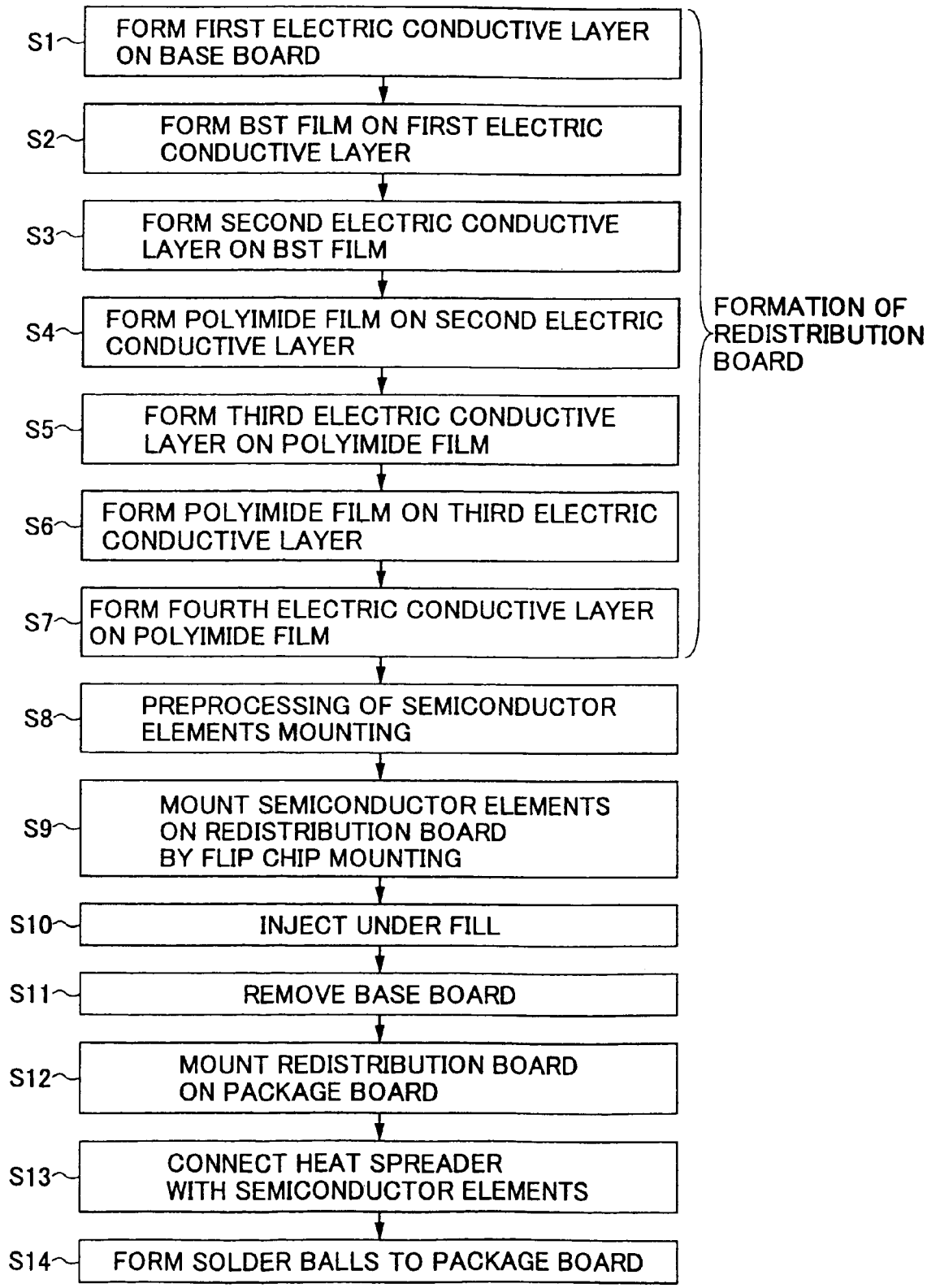
FIG. 4 is a flow chart of the manufacturing process of the semiconductor device shown in FIG. 1.

First, as shown in a flow chart of FIG. 4, the redistribution board 4 is prepared. In step S1, the first electric conductive layer 22 formed by a platinum thin film is formed on a silicon wafer referred to as the base board 20. Next, in step S2, the BST film as the first insulating layer 24 is formed on the first electric conductive layer 22. Then, in step S3, the second electric conductive layer 28 formed by the platinum film is formed on the BST film.

Next, in step S4, a polyimide film as the second insulating layer 30 is formed on the second electric conductive layer 28. In step S5, the third electric conductive layer 32 made of copper plating is formed on the polyimide film. In step S6, a polyimide film as the third insulating layer 36 is formed on the third electric conductive layer 32. In step S7, the fourth electric conductive layer 40 made of copper plating is formed on the polyimide film.

The steps S1 through S7 are the processes for preparing the redistribution board 4. Further, by repeating steps S5 and S6, the number of layers of the redistribution board 4 can be further increased.

When the preparation of the redistribution board 4 is completed, a process is performed for mounting the semiconductor elements 6 and 8 on the redistribution board 4 by flip chip packaging. That is, in step S8, Ni plating is performed as the barrier metal on the electrode pads of the fourth electric conductive layer 40 of the redistribution board 4, and another plating of such as Au, Pd, Sn or the like is performed thereafter. Then, in step S9, the semiconductor elements 6 and 8 to which solder bumps are previously formed are mounted on the fourth electric conductive layer 40 of the redistribution board 4 by flip chip mounting. Instead of solder bonding, Au—Sn bonding may be employed by forming Au stud bumps to the semiconductor elements 6 and 8, and performing tin-plating on the redistribution board 4 side.

Next, in step S10, an under fill material 44 fills between the redistribution board 4 and the semiconductor elements 6 and 8, respectively so as to secure reliability of the flip chip mounting. In this embodiment, the semiconductor elements 6 and 8 are mounted on the redistribution board 4 by flip chip mounting. However, the number of the semiconductor elements mounted may alternately be one, or three or more.

Figure 3A:
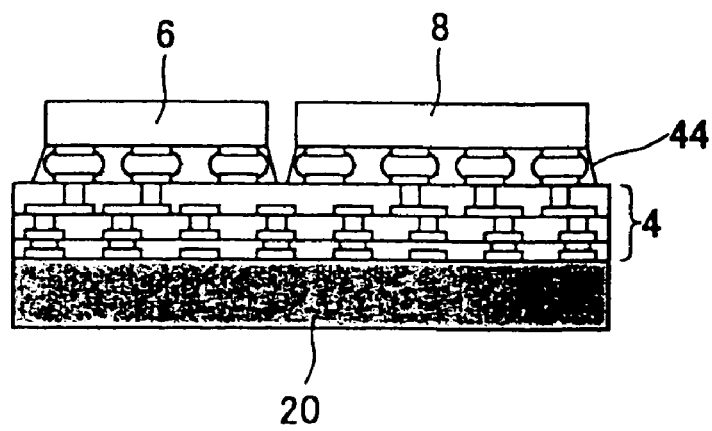
FIGS. 3A, 3B and 3C are cross sectional views for explaining the manufacturing process of the semiconductor device shown in FIG. 1.

As shown in FIG. 3A, the redistribution board 4 assumes a state where the first and second semiconductor elements 6 and 8 are mounted after the above-described processes. The steps S1 through S10 are performed while the redistribution board 4 is formed on the base board 20. Accordingly, the base board 20 functions to reinforce the thin redistribution board 4. Thus, it is possible to perform flip chip mounting of the semiconductor elements 6 and 8 easily, and to prevent the redistribution board 4 from being deformed or damaged.

Figure 3B:
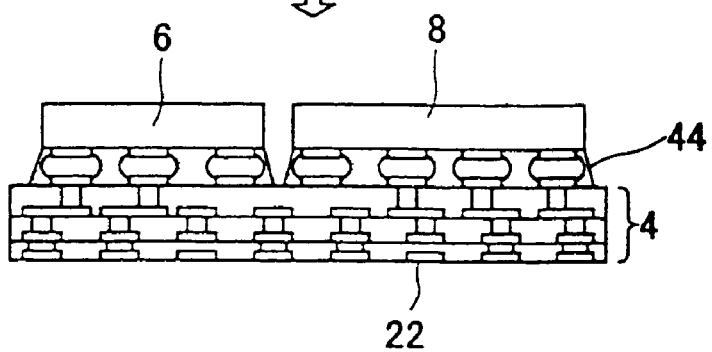

In step 11, the base board 20 made of a silicon board is removed after the semiconductor elements 6 and 8 are mounted on the redistribution board 4 and fixed by the under fill material 44. The base board 20 can be removed by etching or back grind (grinding). The etching and the back grind may be used together. By removing the base board 20, the first electric conductive layer 40 is exposed from a surface of the redistribution board 4 as shown in FIG. 3B.

Further, although the base board 20 is removed, since the semiconductor elements 6 and 8 are fixed on the opposite side of the redistribution board 4 by the under fill material 44, the semiconductor elements 6 and 8 function to reinforce the redistribution board 4 so as to prevent the redistribution board 4 from being deformed or damaged.

Figure 3C:
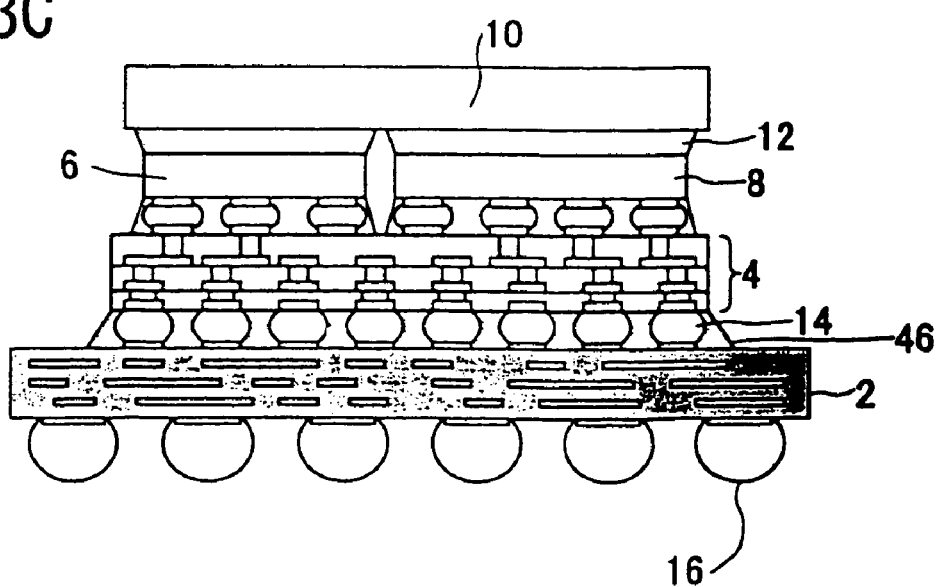

Next, in step 12, solder bumps are formed on the electrode pads made of the first electric conductive layer 22 of the redistribution board 4. The redistribution board 4 is mounted on the package board 2 made of such as glass ceramic board, built-up board or the like. Then, the reliability of the mounting is secured by filling an under fill material 46 between the redistribution board 4 and the package board 2. Then, in step S13, the heat spreader 10 is fixed to the semiconductor elements 6 and 8, respectively, via the adhesive 12. Last, in step S14, solder balls 16 are formed as external terminals to the electrode pads provided on a bottom face side of the package board 2, and the semiconductor device shown in FIG. 3C is accomplished.

When it is not necessary to provide the heat spreader 10 in step S13, step S13 may be skipped to advance to step 14. Additionally, with regard to steps S13 and S14, either step may be performed first.

Further, in the above embodiment, the silicon wafer is used for the base board 20. However, when the base board 20 is in a state of a wafer, it is also possible to form a plurality of redistribution boards 4 on the wafer. In this case, it is preferable that a process of individualizing such as dicing or the like be performed after the process of step S7 ends, or after the process of either step S9 or S10 ends.

Figure 5:
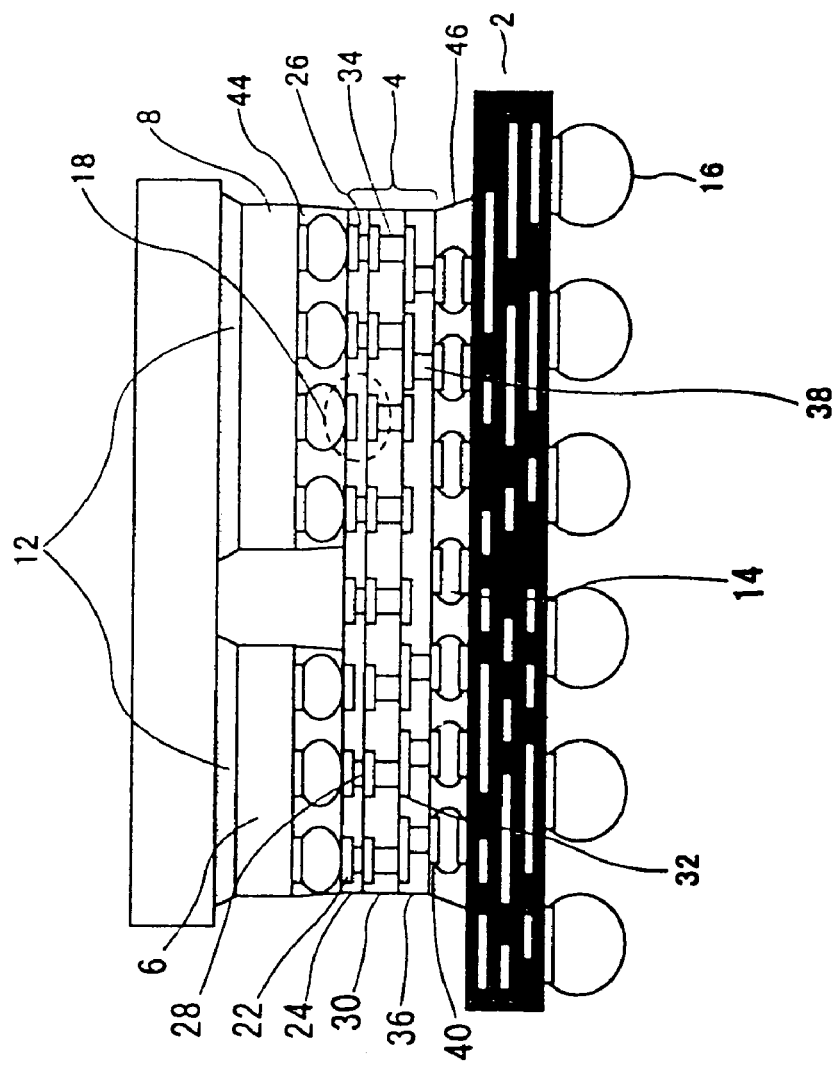
FIG. 5 is a cross sectional view of a semiconductor device according to a second embodiment of the present invention.

Next, a description will be given of a second embodiment of the present invention with reference to FIG. 5. FIG. 5 is a cross sectional view of a semiconductor device according to the second embodiment of the present invention. In FIG. 5, those components which are the same as those corresponding components in FIG. 1 are designated by the same reference numerals, and a description thereof will be omitted.

The semiconductor device according to the second embodiment of the present invention uses the same components as the semiconductor device according to the first embodiment of the present invention. However, there is a difference between the semiconductor device according to the second embodiment of the present invention and the semiconductor device according to the first embodiment of the present invention in that the redistribution board 4 is placed upside down. That is, the electrode pads made of the fourth electric conductive layer 40 of the redistribution board 4 are connected with the electrode pads of the package board 2. The semiconductor elements 6 and 8 are mounted on the electrode pads made of the first electric conductive layer 22.

Figure 6A:
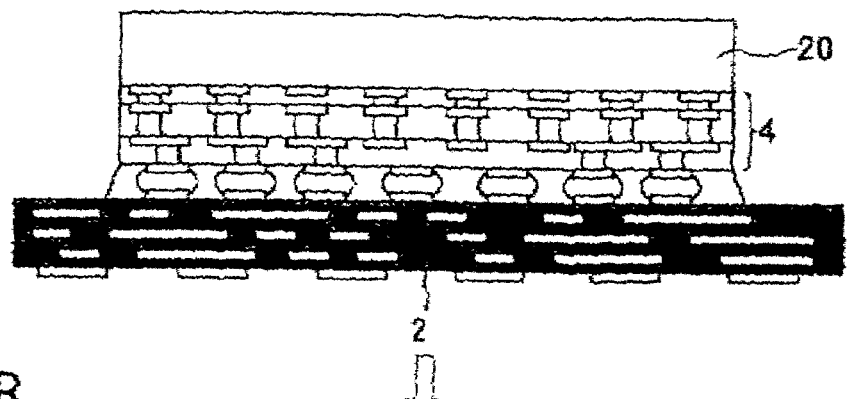
FIGS. 6A, 6B and 6C are cross sectional views for explaining manufacturing process of the semiconductor device shown in FIG. 5.
Figure 6B:
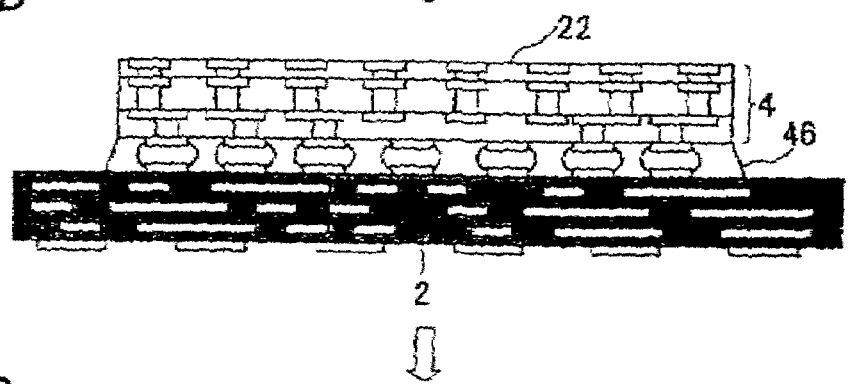
Figure 6C:
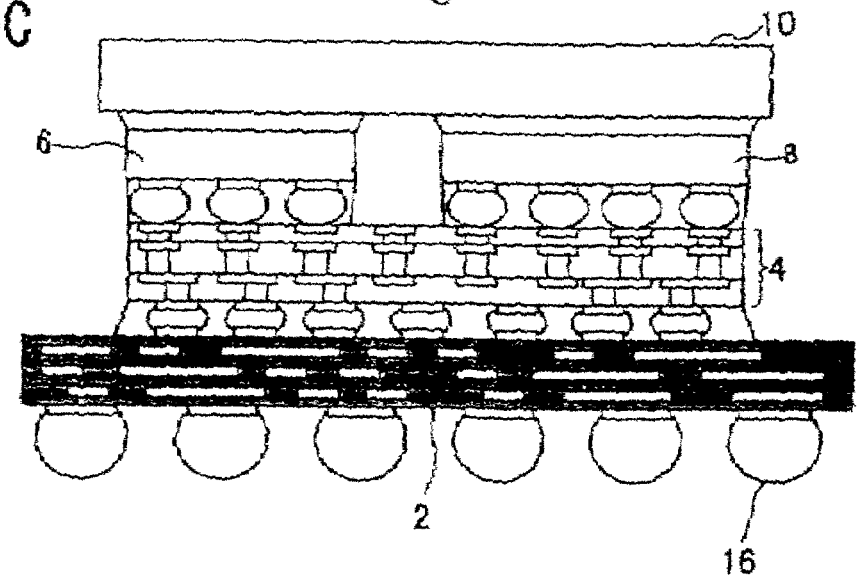
Figure 7:
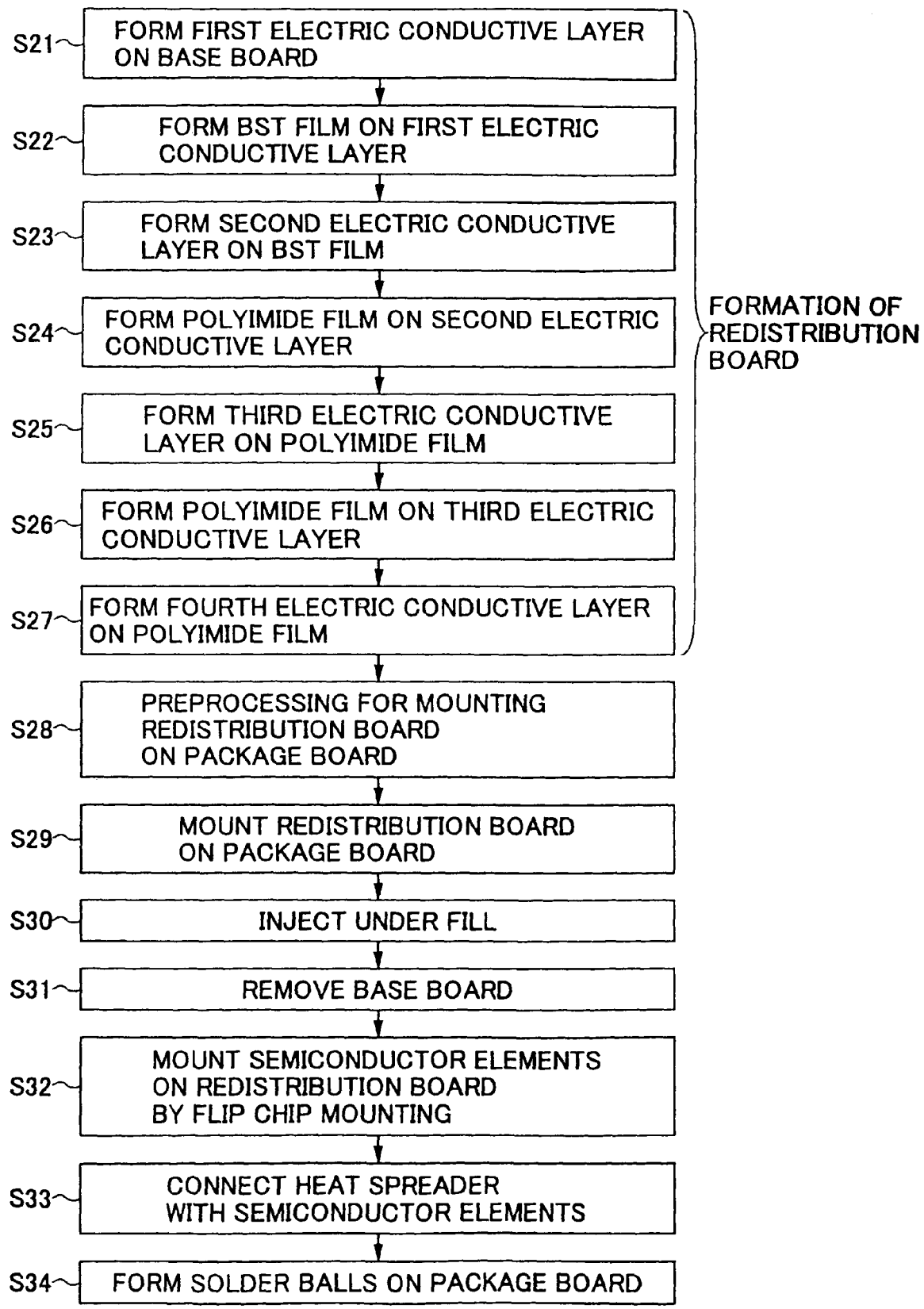
FIG. 7 is a flow chart of the manufacturing process of the semiconductor device shown in FIG. 5.

FIGS. 6A, 6B and 6C are cross sectional views for explaining the manufacturing process of the semiconductor device shown in FIG. 5. FIG. 7 is a flow chart of the manufacturing process of the semiconductor device shown in FIG. 5.

In FIG. 7, steps S21 through S27 are processes for forming the redistribution board 4 the same as the processes of steps S1 through S7 in FIG. 4. In this embodiment, after the redistribution board 4 is formed on the base board 20, a preprocessing is performed for mounting the redistribution board 4 on the package board in step S28. That is, when the redistribution board 4 is mounted by the solder bonding, the solder bumps are formed to the package board. Alternatively, when the redistribution board 4 is mounted by the Au—Sn bonding, Au stud bumps are formed to the electrode pads of the package board 2 and tin-plating process is performed to the electrode pads of the redistribution board 4.

Next, in step S29, as shown in FIG. 6A, the redistribution board 4 is mounted on the package board 2. In step S30, the under fill material 46 is injected between the redistribution board 4 and the package board 2. Thereafter, in step S31, as shown in FIG. 6B, the base board 20 is removed. The base board 20 is removed by the same method as the above-described first embodiment.

As described above, in this embodiment, the redistribution board 4 is mounted on the package board 2 before the base board 20 is removed from the redistribution board 4. Thus, the redistribution board 4 is always reinforced by the base board 20 or the package board 2. Therefore, the deformation of or the damage to the redistribution board 4 due to the redistribution board 4 being by itself without any reinforcement can be prevented.

When the base board 20 is removed in step S31, the first electric conductive layer 22 is exposed from a surface of the redistribution board 4. Then, in step S32, the semiconductor elements 6 and 8 are mounted on the redistribution board 4 by flip chip mounting, and under fill material 44 is filled between the semiconductor elements 6 and 8 and the redistribution board 4, respectively. In step S33, as in the first embodiment, the heat spreader 10 is connected with the semiconductor elements 6 and 8 by the adhesive 12. In step S34, solder balls 16 are formed on the electrode pads on the bottom side surface of the package board 2, and the semiconductor device shown in FIGS. 5 and 6C is completed.

Next, a description will be given of a third embodiment of the present invention with reference to FIGS. 8A, 8B, 8C and 8D. The semiconductor device of the third embodiment of the present invention has the same structure as the semiconductor device of the above-described first or second embodiment. However, the semiconductor device of the third embodiment of the present invention differs from the semiconductor device of the first or second embodiment in the manufacturing process.

In the third embodiment of the present invention, as shown in FIG. 8A, the redistribution board 4 is formed on the base board 20. Thereafter, as shown in FIG. 8B, the base board 20 is separated or removed from the redistribution board 4. Thereafter, the redistribution board 4 is bonded to the semiconductor elements 6 and 8 and the package board 2. As shown in FIG. 8C, the semiconductor elements 6 and 8 may be mounted on the redistribution board 4 previous to the package board 2. Or, as shown in FIG. 8D, the package board 2 may be mounted on the redistribution board 4 previous to the semiconductor elements 6 and 8. In this case, the redistribution board 4 is formed with a thickness to have enough strength even when the base board 20 is separated or removed. Alternatively, a material with enough strength is chosen to form the redistribution board 4.

Figure 9:
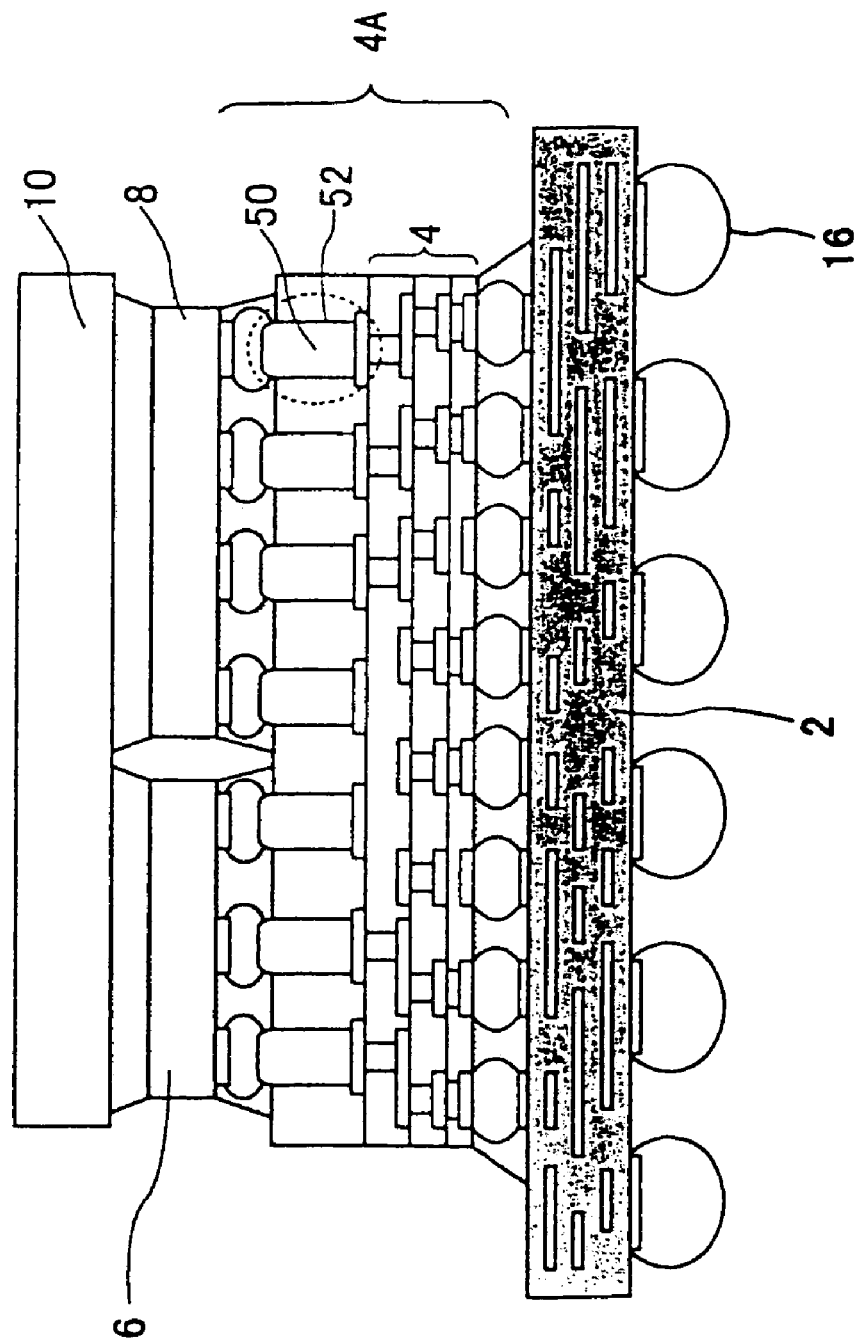
FIG. 9 is a cross sectional view of a semiconductor device according to a fourth embodiment of the present invention.

Next, a description will be given of a fourth embodiment of the present invention with reference to FIG. 9. FIG. 9 is a cross sectional view of a semiconductor device according to the fourth embodiment of the present invention. In FIG. 9, those components which are the same as those corresponding components in FIG. 1 are designated by the same reference numerals, and a description thereof will be omitted.

The semiconductor device according to the present invention has the same structure as the semiconductor device of the above-described first embodiment. However, a structure of a redistribution board 4A is different from the above-described redistribution board 4. That is, as shown in FIG. 9, the redistribution board 4A of this embodiment further includes a columnar metal member 50 (also referred to as a metal pillar or metal post) on the fourth electric conductive layer 40 structuring the electrode pads. Then, by filling insulating resin 52 between the metal pillars 50, the adjacent metal pillars 50 are insulated and held separate from each other.

A height of the metal pillar is 100 μm, for example. A thickness of the insulating resin layer is from 70 to 80 μm. By reinforcement effect of the insulating resin layer 52, the redistribution board 4A has enough rigidity so as to prevent the deformation of or the damage to the redistribution board 4A.

FIGS. 10A, 10B, 10C and 10D are cross sectional views for explaining a manufacturing process of the redistribution board 4A. In order to form the metal pillars 50 on the fourth electric conductive layer 40, after forming the redistribution board 4, a barrier metal layer (an illustration thereof is omitted) of such as Ti, Cr or the like is formed on the fourth electric conductive layer 40 by a sputter apparatus. Then, as shown in FIG. 10A, a dry film made of a photo resist is attached to the barrier metal layer. Through-holes corresponding the figure of the metal pillars 50 are formed to the dry film using a photolithography technology. The thickness of the dry film used is the same as the height of the metal pillars to be formed. Then, as shown in FIG. 10B, the metal pillars 50 are formed by depositing copper in the through-holes of the dry film according to a Cu electrolytic plating method.

Figure 11:
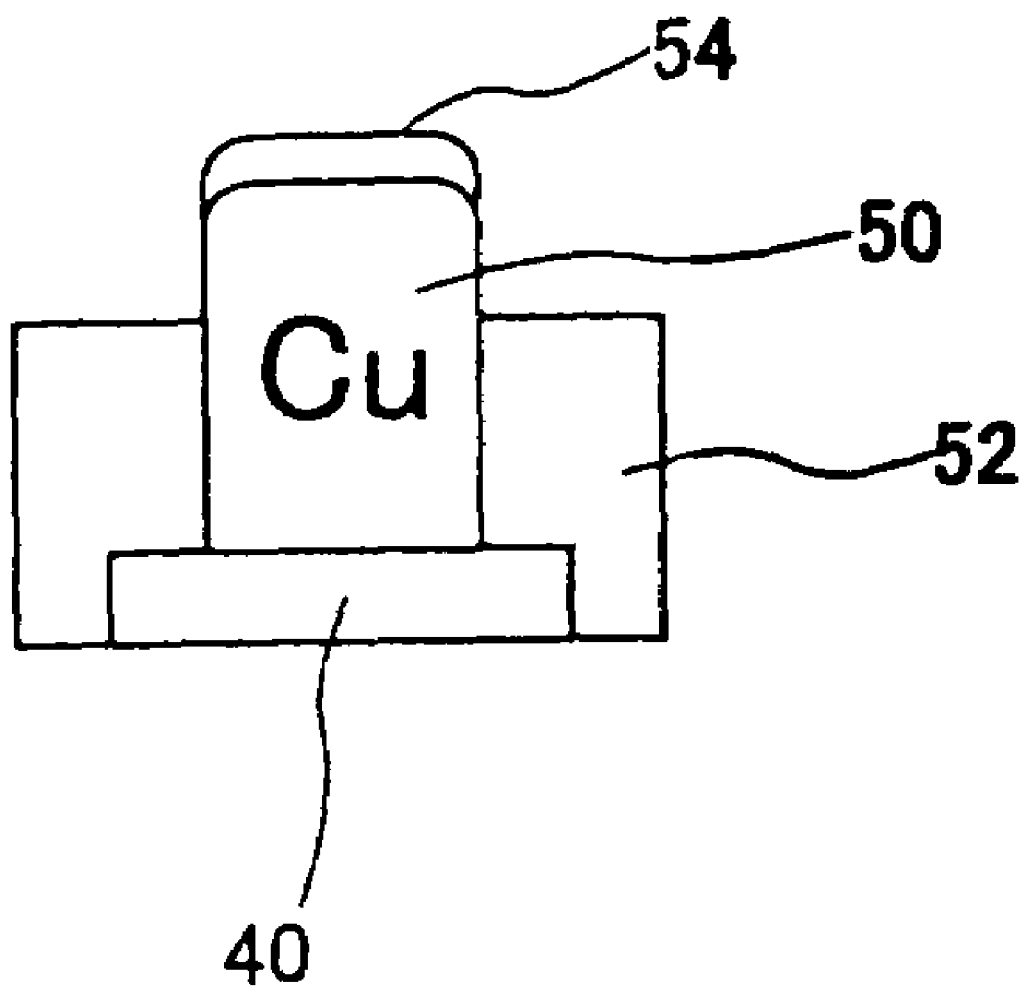
FIG. 11 is an enlarged view of a part surrounded by a broken line in FIG. 9.

After the metal pillars 50 are formed, plated layers 54 are formed on projecting parts of the insulating resin layer 52 as shown in FIG. 11 such that heads of the metal pillars 50 function as electrode pads for mounting the semiconductor elements 6 and 8. It is preferable that the plated layer 54 have a double layer structure such that the barrier metal layer made of a Ni plated layer is formed on a part contacting a surface of the metal pillar 50, and a Pd plated layer or a Au plated layer for improving solder bonding efficiency is formed thereon. A triple layer structure may also be applied such that the Pd plated layer is formed on the Ni plated layer, and the Au plated layer is formed thereon.

After the plated layer 54 is formed, the dry film is removed as shown in FIG. 10C. Thereafter, as shown in FIG. 10D, the insulating resin layer 52 is formed by filling the insulating resin between the metal pillars 50. In filling the insulating resin, a method of injecting an epoxy resin in liquid form or a method of filling the epoxy resin by transfer molding, for example, may be used.

The semiconductor elements 6 and 8 are mounted on the redistribution board 4A formed as described above by flip chip mounting in the same method as the above-described first embodiment. Besides, the redistribution board 4A is mounted on the package board 2 and incorporated in the semiconductor device shown in FIG. 9.

As described above, the redistribution board 4A according to the present invention has rigidity increased by the insulating resin layer 52. Thus, the redistribution board 4A can prevent the deformation or damage in the manufacturing process of the semiconductor device and improve a production yield of the semiconductor device.

Figure 12:
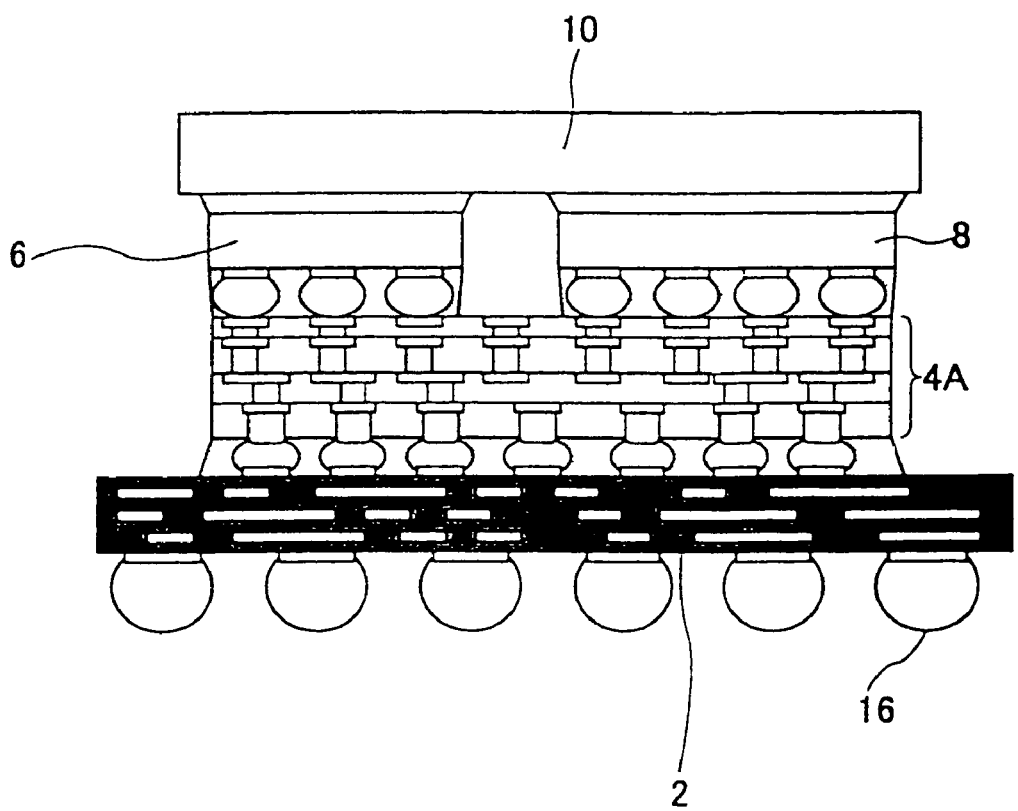
FIG. 12 is a cross sectional view of a semiconductor device according to a fifth embodiment of the present invention.

Next, a description will be given of a fifth embodiment of the present invention with reference to FIG. 12. FIG. 12 is a cross sectional view of a semiconductor device according to the fifth embodiment of the present invention. In FIG. 12, those components which are the same as those corresponding components in FIG. 9 are designated by the same reference numerals, and a description thereof will be omitted.

The semiconductor device according to this embodiment has the same components as the semiconductor device according to the above-described fourth embodiment, except that the redistribution board 4A is placed upside down. That is, the metal pillars 50 of the redistribution board 4A are connected with the electrode pads of the package board 2. The semiconductor elements 6 and 8 are mounted on the electrode pads made of the electric conductive layer 22.

A manufacturing method of the semiconductor device according to this embodiment is the same as the manufacturing method of the semiconductor device according to the above-described second embodiment, except that the redistribution board 4 is replaced with the redistribution board 4A. Thus, a detailed description thereof will be omitted.

As the above-described fourth embodiment, the redistribution board 4A of this embodiment has rigidity increased by the insulating resin layer 52. Thus, the redistribution board 4A can prevent the deformation or damage in the manufacturing process of the semiconductor device, and improve the production yield of the semiconductor device.

Figure 13:
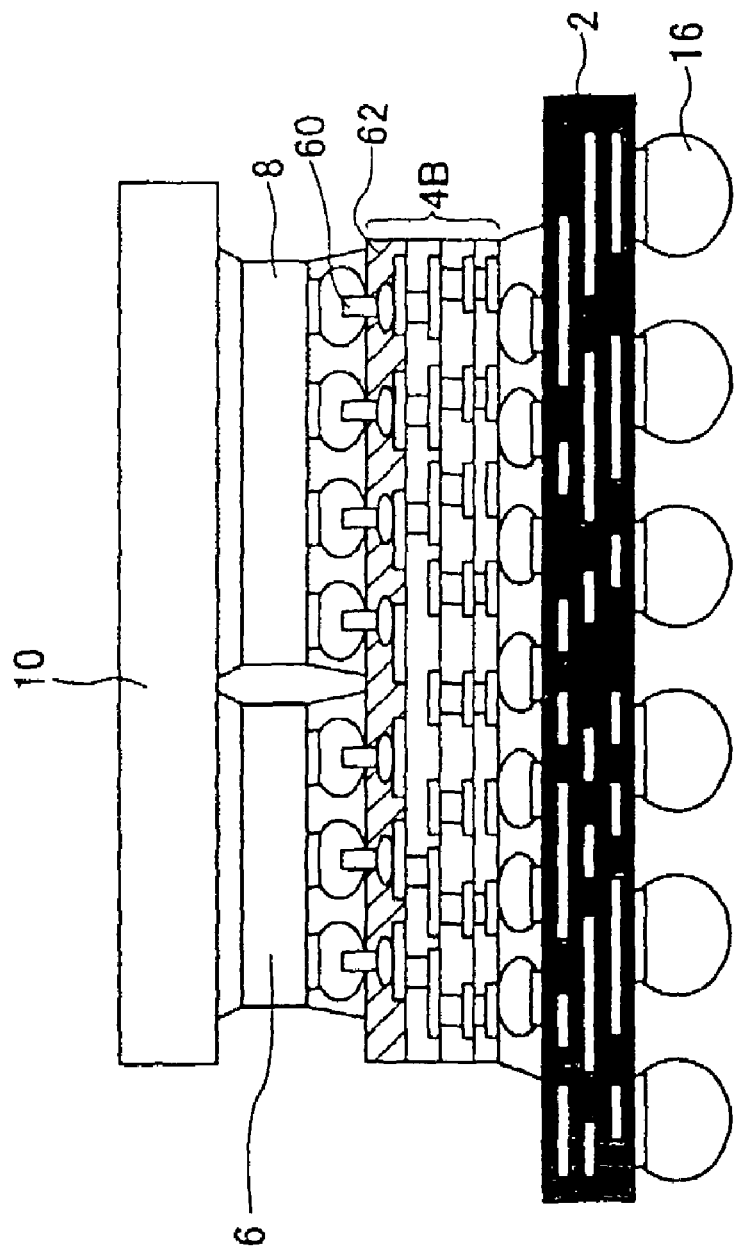
FIG. 13 is a cross sectional view of a semiconductor device according to a sixth embodiment of the present invention.

Next, a description will be given of a sixth embodiment of the present invention with reference to FIG. 13. FIG. 13 is a cross sectional view of a semiconductor device according to the sixth embodiment of the present invention. In FIG. 13, those components which are the same as those corresponding components in FIG. 1 are designated by the same reference numerals, and a description thereof will be omitted.

The semiconductor device according to this embodiment has basically the same structure as the semiconductor device according to the above-described first embodiment except that a structure of a redistribution board 4B differs from the structure of the redistribution board 4. That is, as shown in FIG. 13, the redistribution board 4B of this embodiment further has micro pins 60 as columnar metal members on the fourth electric conductive layer 40 structuring the electrode pads. Then, insulating resin 62 is filled between the micro pins 60 so as to insulate and hold the adjacent micro pins separate from each other.

A height of a micro pin is 100 $\mu$m, for example. A thickness of the insulating resin layer 62 is from 70 to 80 $\mu$m. By reinforcement effect of the insulating resin layer 62, the redistribution board 4B has enough rigidity so as to prevent the deformation of or the damage to the redistribution board 4B.

Figure 14A:
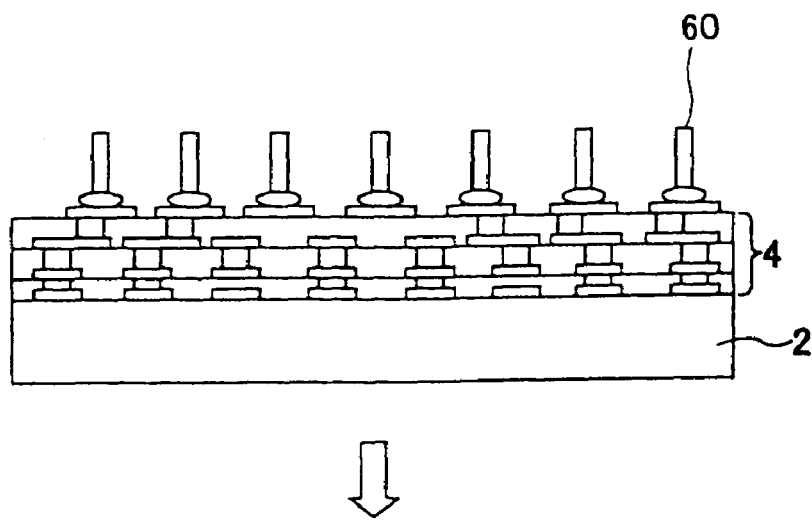
FIGS. 14A and 14B are cross sectional views for explaining the manufacturing process of the redistribution board shown in FIG. 13.

As shown in FIG. 14A, the micro pins 60 are formed such that metal wires such as gold wires or the like are bonded to the fourth electric conductive layer 40. Then, heads of the metal wires are cut off so as to obtain a length (height) of 100 $\mu$m, for example, in a direction of the thickness of the redistribution board 4. Each of the micro pins 60 are provided to the fourth electric conductive layer 40 so as to extend nearly vertically therefrom and not to contact each other.

Figure 14B:
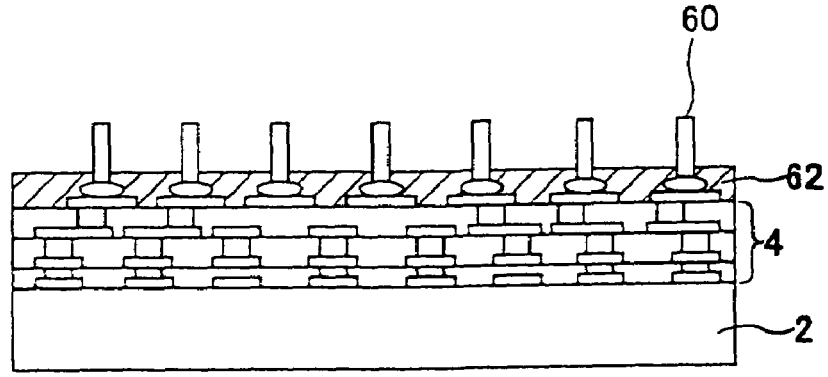

When the micro pins 60 are formed, surfaces of the micro pins 60 are nickeled by an electroless plating method and gilded. The Ni plating functions as the barrier metal, and the gold plating is for improving the solder bonding efficiency. Next, as shown in FIG. 14B, insulating resin such as an epoxy resin or the like fills between the micro pins 60 so as to form the insulating resin layer 62.

The semiconductor elements 6 and 8 are mounted on the redistribution board 4B formed as described above by flip chip mounting in the same method as the above-described first embodiment. Besides, the redistribution board 4B is mounted on the package board 2 and is incorporated in the semiconductor device shown in FIG. 13.

As described above, the redistribution board 4B according to this embodiment has rigidity increased by the insulating resin layer 62. Thus, the redistribution board 4B can prevent the deformation or damage in the manufacturing process of the semiconductor device and improve the production yield of the semiconductor device.

Figure 15:
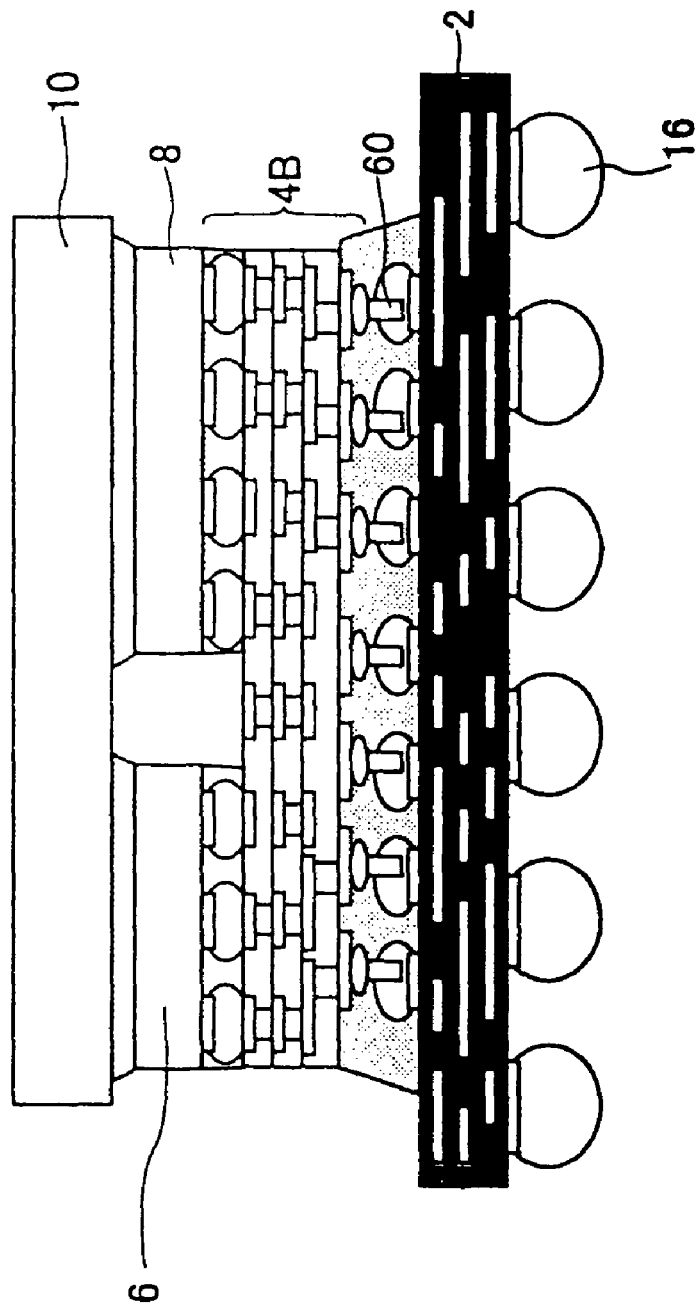
FIG. 15 is a cross sectional view of a semiconductor device according to a seventh embodiment of the present invention.

Next, a description will be given of a seventh embodiment of the present invention with reference to FIG. 15. FIG. 15 is a cross sectional view of a semiconductor device according to a seventh embodiment of the present invention. In FIG. 15, those components which are the same as those corresponding components in FIG. 13 are designated by the same reference numerals and a description thereof will be omitted.

The semiconductor device according to this embodiment has the same components as the semiconductor device according to the above-described fourth embodiment except that the redistribution board 4B is placed upside down. That is, the metal pillars 50 of the redistribution board 4B are connected with the electrode pads of the package board 2. The semiconductor elements 6 and 8 are mounted on the electrode pads made of the first electric conductive layer 22.

A manufacturing method of the semiconductor device according to this embodiment is the same as the manufacturing method of the semiconductor device according to the above-described second embodiment, except that the redistribution board 4 is replaced with the redistribution board 4B. Thus, a detailed description thereof will be omitted.

However, it should be noted that the insulating resin layer 62 is not provided for the redistribution board 4B. Each micro pin stands erect by itself. Thus, the micro pin 60 may not contact with the adjacent micro pin 60 when the insulating resin does not fill between the micro pins 60. Accordingly, the under fill material 46 fills between the micro pins 60 after the redistribution board 4B formed on the base board 20 is mounted on the package board 2 by soldering via the micro pins 60.

Additionally, when the insulating resin layer 62 is provided, the under fill material 46 may not be necessary. Further, since the micro pins have spring characteristics, the micro pins can stand a heat cycle, shock or the like when the micro pins are connected with the bumps.

In each of the above-described embodiments, a silicon board is used as the base board 20. However, a board made of other material may also be used.

For example, when a sapphire board is used as the base board 20, the base board 20 can be separated from the redistribution board by irradiation of a laser beam. That is, a thin organic film is formed on the sapphire board so as to form the redistribution board thereon. Then, the sapphire board is separated from the redistribution board by irradiating the laser beam on the sapphire board and vaporizing the organic film.

Additionally, when the base board 20 is formed by copper or copper alloy, the base board 20 can be removed by dipping only the base board 20 in etchant and dissolving the copper or copper alloy. In this case, it is preferable to previously perform resin courting so as not to expose the copper from a wiring layer, a circuit element or the package board of the components of the semiconductor device.

Further, as a method of separating the base board, there is a method of forming the redistribution board on a water soluble exfoliating layer previously formed on the base board 20. As a material of the water soluble exfoliating layer, potassium bromide KBr may be used. By forming the redistribution board on the water soluble exfoliating layer formed on the base board 20 and dipping the redistribution board and the base board 20 in water, the water soluble exfoliating layer is dissolved and the base board 20 is separated from the redistribution board.

Additionally, the base board 20 can be dissolved in water to be removed by forming the base board 20 itself of a water soluble material such as potassium bromide KBr.

Additionally, in order to separate the base board and the redistribution board (wiring layer) easily, the redistribution board may be formed by forming a copper (Cu) sputter film on a ceramic board of such as aluminum nitride or the like, and forming the wiring layer or the like on the Cu sputter layer by photolithography. Since adhesion between the Cu sputter film and the ceramic board is weak, the Cu sputter layer easily exfoliates from the ceramic board. After exfoliating the ceramic board including the Cu sputter film from the redistribution board, the Cu sputter film is removed by the etching, and electrodes for connecting with the package board and the semiconductor elements are exposed. A forming method of the redistribution board is the same as the above-described embodiments, and a description thereof will be omitted.

The present invention is not limited to the specifically disclosed embodiments, and variations and modifications may be made without departing from the scope of the present invention.

The present application is based on Japanese priority application No. 2001-335413 filed on Oct. 31, 2001, the entire contents of which are hereby incorporated by reference.

What is claimed is:

1. A manufacturing method of a semiconductor device, comprising:
   a step of forming an electrically conductive material film on a base board;
   a redistribution board forming step of forming a redistribution board on the base board, wherein the redistribution board forming step includes the step of applying copper plating on the electrically conductive material film;
   a base board separating step of separating the base board from the redistribution board;
   a semiconductor element mounting step of mounting at least one semiconductor element on the redistribution board via electrode pads formed on a surface of the redistribution board.

2. The manufacturing method of the semiconductor device as claimed in claim 1, wherein the step of forming the redistribution board includes the step of forming the redistribution board incorporating a passive element on the base board.

3. The manufacturing method of the semiconductor device as claimed in claim 1, further comprising a redistribution board mounting step of mounting the redistribution board on a package board via electrode pads formed on an other surface of the redistribution board.

4. The manufacturing method of the semiconductor device as claimed in claim 1, wherein the base board is made of a silicon wafer, a plurality of the redistribution boards are integrally formed on said silicon wafer, and the redistribution boards are individualized after the base board removing step.

5. The manufacturing method of the semiconductor device as claimed in claim 1, wherein:
   the base board is made of a sapphire board including a thin organic film formed on a surface where the redistribution board is formed; and
   the base board separating step includes a step irradiating a laser beam to the thin organic film via the sapphire board and vaporizing the thin organic film.

6. The manufacturing method of the semiconductor device as claimed in claim 1, wherein:
   the base board is made of silicon; and
   the base board separating step includes a step of removing the silicon by using etching.

7. The manufacturing method of the semiconductor device as claimed in claim 6, wherein the base board separating step includes the step of removing the silicon by using etching and grinding together.

8. The manufacturing method of the semiconductor device as claimed in claim 1, wherein:
   the base board is made of copper or copper alloy; and
   the base board separating step includes a step of etching the base board.

* * * * *